(12) United States Patent
Haseyama

(10) Patent No.: US 6,445,200 B2
(45) Date of Patent: *Sep. 3, 2002

(54) SEMICONDUCTOR ELEMENT TESTING CARRIER USING A MEMBRANE CONTACTOR AND A SEMICONDUCTOR ELEMENT TESTING METHOD AND APPARATUS USING SUCH A CARRIER

(75) Inventor: Makoto Haseyama, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/190,028

(22) Filed: Nov. 12, 1998

(30) Foreign Application Priority Data

Feb. 19, 1998 (JP) ............................................. 10-037718

(51) Int. Cl.⁷ ............................. G01R 31/02; G01R 1/04
(52) U.S. Cl. ..................... 324/755; 324/754; 324/158.1
(58) Field of Search ................................. 324/755, 754, 324/760, 72.5, 158.1

(56) References Cited

U.S. PATENT DOCUMENTS

| | | | |
|---|---|---|---|
| 5,355,079 A | | 10/1994 | Evans et al. |
| 5,500,605 A | * | 3/1996 | Chang ........................ 324/758 |
| 5,757,199 A | * | 5/1998 | Maruyama .................. 324/754 |
| 5,828,224 A | * | 10/1998 | Maruyama .................. 324/755 |
| 5,831,441 A | * | 11/1998 | Motooka et al. ............. 324/754 |
| 5,929,647 A | * | 7/1999 | Akram et al. ................ 324/755 |
| 5,986,459 A | * | 11/1999 | Fukaya et al. .............. 324/755 |
| 6,033,233 A | * | 3/2000 | Haseyama et al. ............ 439/66 |
| 6,094,057 A | * | 7/2000 | Hiruta et al. ................ 324/755 |
| 6,175,241 B1 | * | 1/2001 | Motooka et al. ............. 324/754 |
| 6,191,604 B1 | * | 2/2001 | Haseyama .................. 324/754 |
| 6,229,320 B1 | * | 5/2001 | Haseyama .................. 324/754 |

FOREIGN PATENT DOCUMENTS

| | | | | |
|---|---|---|---|---|
| JP | 05072268 A | * | 3/1993 | .................. 324/765 |
| JP | 2000188163 A | * | 7/2000 | ........... G01R/31/26 |

* cited by examiner

Primary Examiner—Michael Sherry
Assistant Examiner—Jermele Hollington
(74) Attorney, Agent, or Firm—Armstrong, Westerman & Hattori, LLP

(57) ABSTRACT

A semiconductor element testing carrier prevents a semiconductor element from being displaced relative to a membrane contactor during a testing operation and an attaching operation of the semiconductor element to a semiconductor element testing carrier. The semiconductor element testing carrier holds a semiconductor element to be tested so as to obtain an electrical contact with electrodes of the semiconductor element, the semiconductor element having a first surface on which the electrodes are formed and a second surface opposite to the first surface. A membrane contactor has a front surface and a back surface opposite to the front surface. The membrane contactor contacts the electrodes of the semiconductor element being placed on the front surface of the membrane contactor. A pressing unit presses the membrane contactor toward the semiconductor element from a side of the back surface of membrane contactor. A pressing and holding member holds the second surface of the semiconductor element. A contacting part is protrudingly formed on one of the pressing and holding member and the membrane contactor so that the semiconductor element is held between the membrane contactor and the pressing and holding member while the membrane contactor contacts the pressing and holding member via the contacting part.

16 Claims, 11 Drawing Sheets

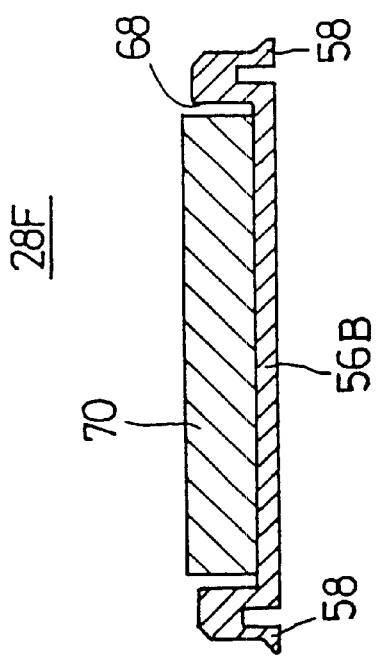
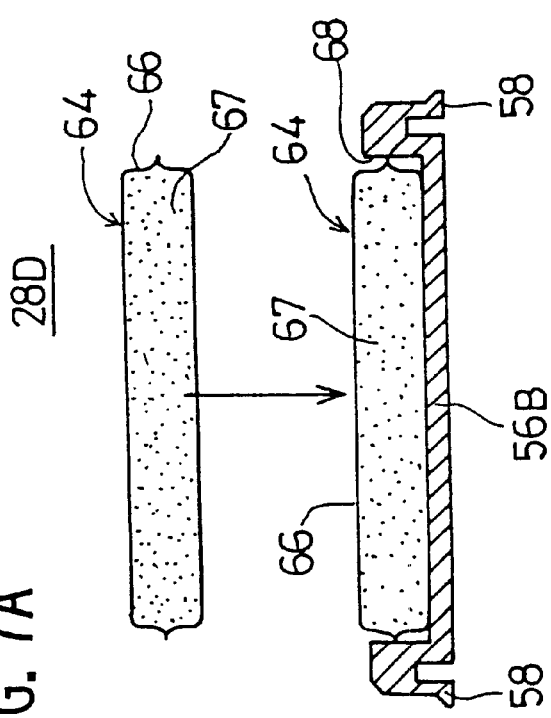
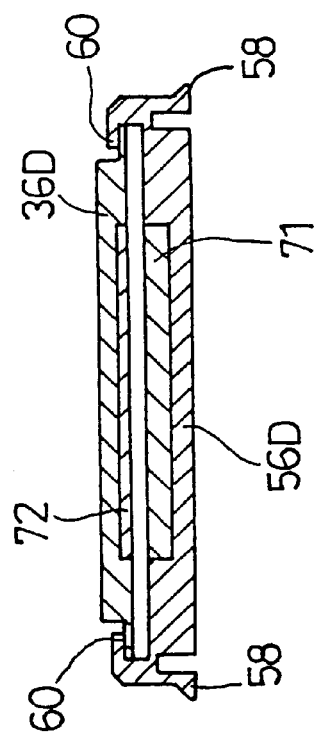
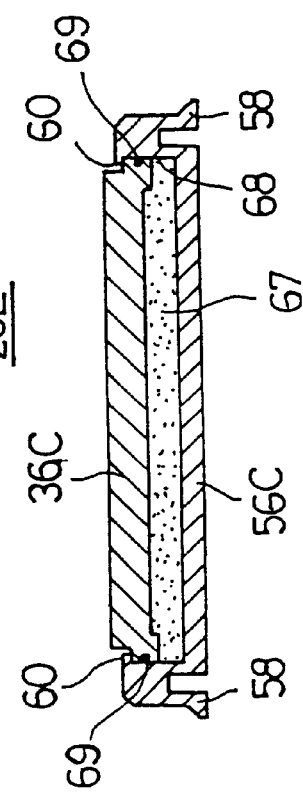

20E

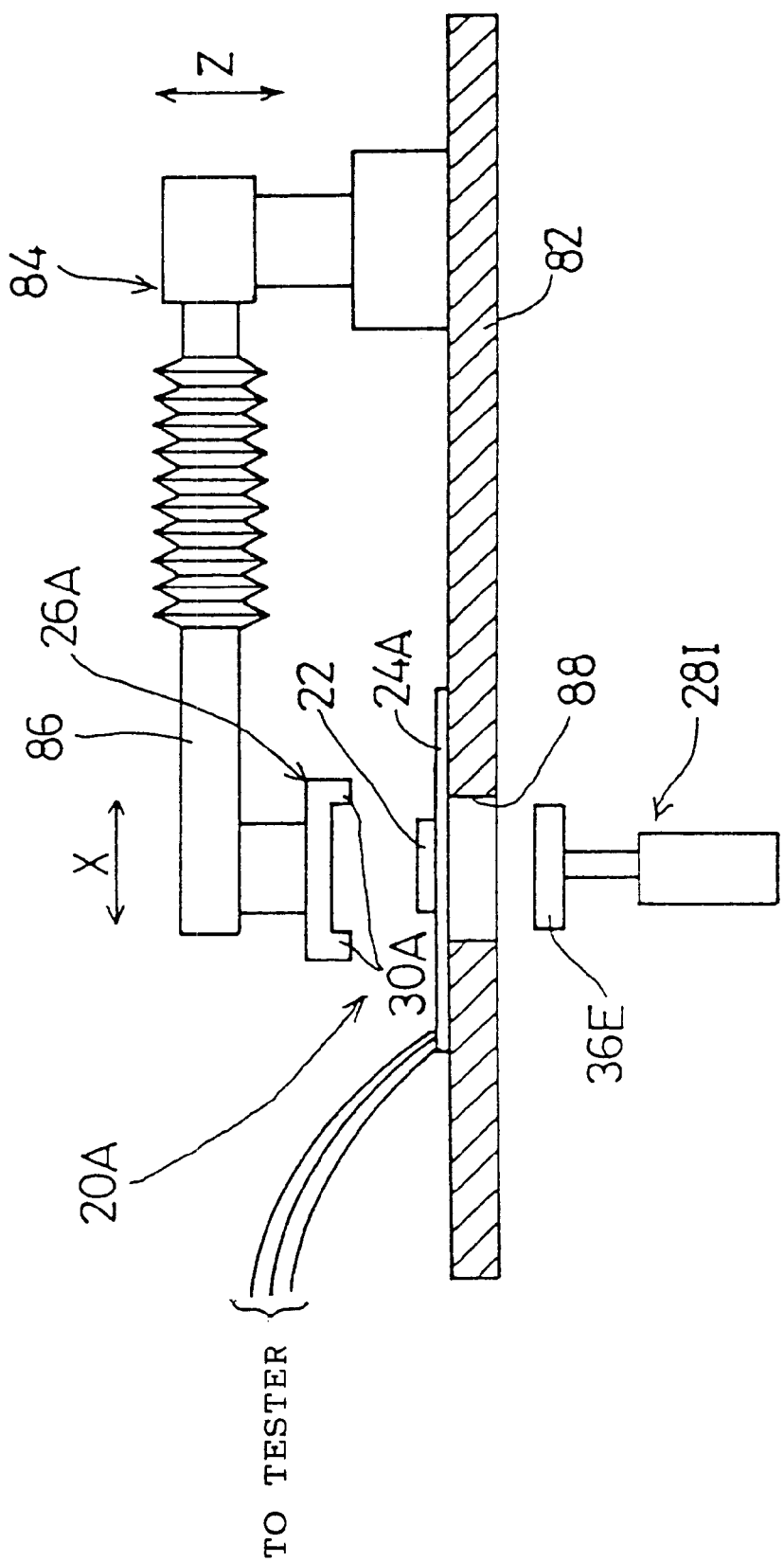

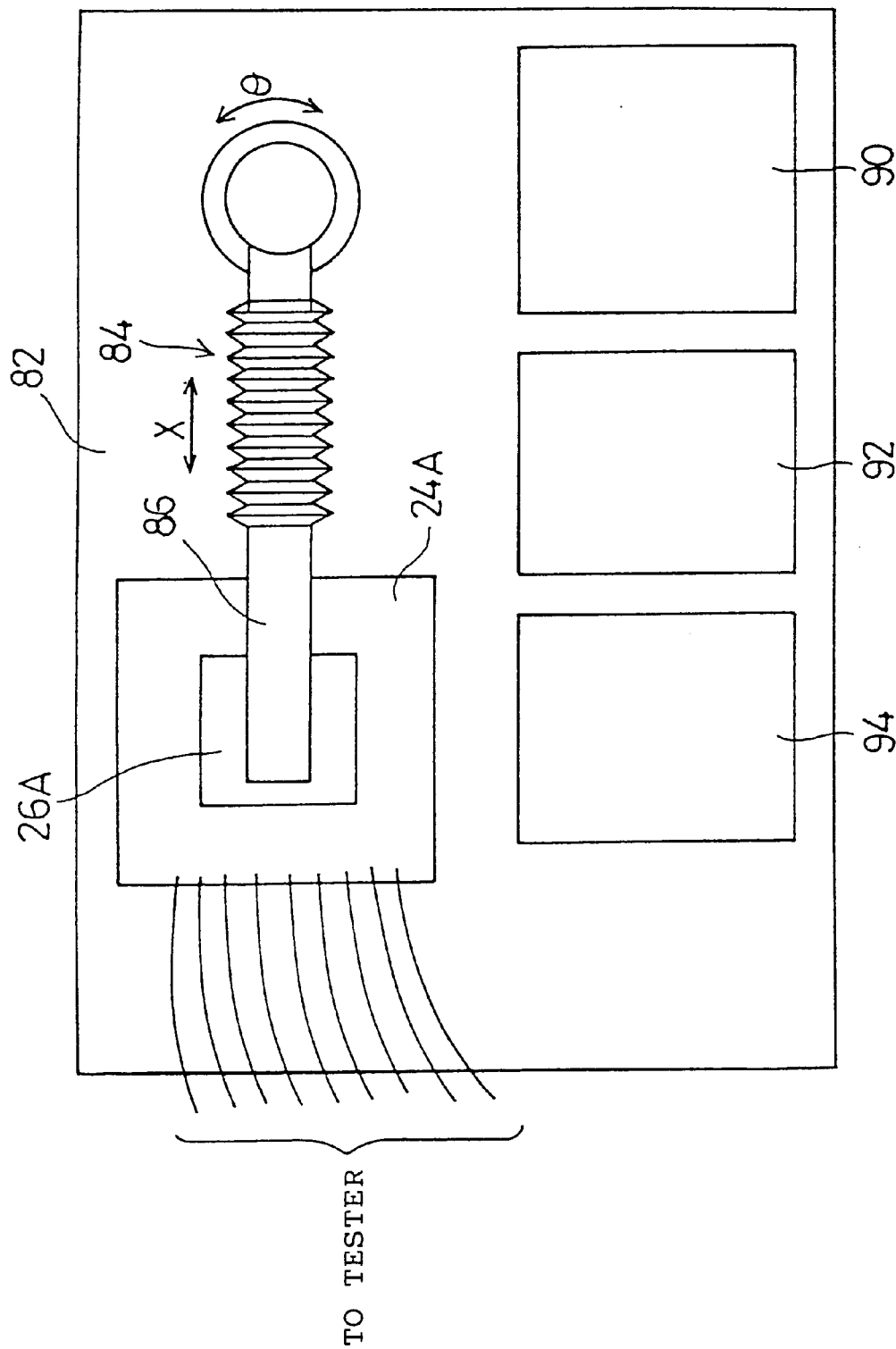

SEMICONDUCTOR ELEMENT TESTING CARRIER USING A MEMBRANE CONTACTOR AND A SEMICONDUCTOR ELEMENT TESTING METHOD AND APPARATUS USING SUCH A CARRIER

BACKGROUND OF THE INVENTION

1. Field of the Invention

The present invention relates to a semiconductor element testing carrier for holding a semiconductor element to be tested and, more particularly, to a semiconductor element testing carrier using a membrane contactor which is temporarily connected to terminals of the semiconductor element so as to provide tester signals to the semiconductor element during a test process.

The semiconductor element to be tested by being held in such a carrier may include a bare chip type semiconductor element, a ball grid array (BGA) type semiconductor element, a small outline package (SOP) type semiconductor element or a quad flat package (QFP) type semiconductor element.

As miniaturization, high speed and high densification are required for recent electronic circuits, attempts are made to form finer electrodes provided on a semiconductor element. When a test is performed on such a semiconductor element having fine electrodes, a contactor which can achieve a reliable electrical connection is required.

As for a contactor satisfying such a requirement, a membrane contactor has been suggested and use of the membrane contactor has being increasing. The membrane contactor is formed by a polyimide film with a conductive pattern provided thereon. Accordingly, a semiconductor element testing carrier using such a membrane contactor has been developed, especially for testing a bare chip type semiconductor element.

2. Description of the Related Art

In a conventional semiconductor element testing carrier using a membrane contactor, a semiconductor element to be tested is placed at a predetermined position of the membrane contactor, and thereafter, a pressing unit is placed on a back side of the semiconductor element which back side is opposite to the side being contacted by the membrane contactor so as to press the semiconductor element against the membrane contactor. That is, the conventional carrier has a three-stage arrangement such as the membrane contactor-the semiconductor element-the pressing unit arranged in that order from the bottom side.

FIG. 1 is a side view of the conventional semiconductor element testing carrier. The semiconductor element testing carrier 1 shown in FIG. 1 comprises a membrane contactor 3, a frame 4, a cap 5, a pressing unit 7, a fence 10 and a cushion member 11.

The membrane contactor 3 has tester pads (not shown in the figure) on a periphery thereof so that tester signals are provided to the tester pads. The membrane conductor 3 is placed on the frame 4. The fence 10 is provided on the membrane contactor 3 so as to place a semiconductor element 2 at a predetermined position of the membrane contactor 3. The fence 10 also serves to fix the semiconductor element 2 so that the semiconductor element 2 is not displaced when a shock or vibration is applied to the semiconductor element testing carrier 1.

The pressing unit 7 comprises a press plate 8 and a coil spring 9. An upper end of the coil spring 9 is engaged with the cap 5 positioned above the frame 4. The cap 5 is supported by connecting rods 6 extending from the frame 4. A lower end of the coil spring 9 is engaged with the press plate 8 so as to apply a spring force to the press plate 8. Accordingly, the pressing unit 7 presses the semiconductor element 2 toward the membrane contactor 3 via the press plate 8. Thereby, a good electric contact is achieved between the semiconductor element 2 and the membrane contactor 3.

Additionally, the frame 4 is provided with a cavity formed at a position under a position where the semiconductor element 2 is placed so that the cushion member 11 is accommodated in the cavity. The cushion member 11 contacts the membrane contactor 3 at a position opposite to the semiconductor element 2 so as to receive a pressing force applied by the pressing unit 7.

Additionally, when attaching the semiconductor element 2 to the semiconductor element testing carrier 1, first the semiconductor element 2 is placed at the predetermined position of the membrane contactor 3. At this time, the semiconductor element 2 must be precisely positioned so that the electrodes of the membrane contactor 3 are reliably connected to the electrodes of the semiconductor element 2. Thereafter, the pressing unit 7 is attached so as to press the semiconductor element 2 in a direction from the back side of the semiconductor element 2 to the membrane contactor 3. A test is performed on the semiconductor element 2 while the semiconductor element 2 is held by the semiconductor element testing carrier.

The above-mentioned conventional semiconductor element testing carrier 1 is arranged so that the pressing unit 7 is attached after the semiconductor element 2 is placed on the membrane contactor 3. Additionally, the pressing unit 7 (the press plate 8) directly contacts the semiconductor element 2. Accordingly, there is a problem in that the semiconductor element 2 is displaced relative to the membrane contactor 3 due to a shock applied by the press plate 8 to the semiconductor element 2 when the pressing unit 7 is set.

Additionally, when a shock or vibration is applied to the semiconductor element testing carrier 1 during a testing process, such a shock or vibration is directly transmitted to the semiconductor element 2. Thereby, the semiconductor element 2 may be displaced relative to the membrane contactor 3 after the assembly of the semiconductor element 2 to the semiconductor element testing carrier 1 has been completed. Thus, there is a problem in that the electrodes of the semiconductor element 2 and the membrane contactor 3 may be damaged when a displacement occurs between the semiconductor element 2 and the membrane contactor 3, which results in an incomplete electric connection.

SUMMARY OF THE INVENTION

It is a general object of the present invention to provide an improved and useful semiconductor element testing carrier in which the above-mentioned problems are eliminated.

A more specific object of the present invention is to provide a semiconductor element testing carrier which can prevent a semiconductor element from being displaced relative to a membrane contactor both during a testing operation and during an attaching operation of the semiconductor element to a semiconductor element testing carrier.

In order to achieve the above-mentioned objects, there is provided according to one aspect of the present invention a semiconductor element testing carrier for holding a semiconductor element to be tested so as to obtain an electrical contact with electrodes of the semiconductor element, the semiconductor element having a first surface on which the electrodes are formed and a second surface opposite to the first surface, the semiconductor element testing carrier comprising:

a membrane contactor having a front surface and a back surface opposite to the front surface, the membrane contactor contacting the electrodes of the semiconductor element being placed on the front surface of the membrane contactor;

a pressing unit pressing the membrane contactor toward the semiconductor element from a side of the back surface of the membrane contactor;

a pressing and holding member holding the second surface of the semiconductor element; and a contacting part protrudingly formed on one of the pressing and holding member and the membrane contactor so that the semiconductor element is held between the membrane contactor and the pressing and holding member while the membrane contactor contacts the pressing and holding member via the contacting part.

According to the above-mentioned invention, the pressing unit presses the membrane contactor from a side opposite to a side where the semiconductor element is placed. That is, the pressing unit does not directly press the semiconductor element. Additionally, the pressing and holding member holds the second surface of the semiconductor element, the second surface being opposite to the surface which contacts the membrane contactor. Further, the holding and pressing member contacts the membrane contactor via the contacting part formed on one of the pressing and holding member and the membrane contactor. Accordingly, if a shock or vibration is applied to the pressing and holding member, the semiconductor element does not move relative to the membrane contactor since the pressing and holding member is supported on membrane contactor. Additionally, since the shock or vibration applied to the pressing and holding member is transmitted to the membrane contactor via the contacting part, a damage to the semiconductor element can be reduced.

Additionally, in the semiconductor element testing carrier according to the present invention, the membrane contactor may be provided with a frame member made of a hard material, the frame member being attached to a periphery of the membrane contactor so that the frame member surrounds the pressing and holding member.

Accordingly, the periphery of the membrane contactor having a flexibility is supported by the frame member, which support facilitates handling the membrane contactor during a test process. Additionally, when a tester probe comes into contact with the membrane contactor in the test process, a reliable contact of the test probe can be achieved by the presence of the frame member which is made of a hard material.

Additionally, the semiconductor element testing carrier according to the present invention may further comprise a contactor attaching member supporting the back surface of the membrane contactor, the contactor attaching member having an opening aligning with the semiconductor element placed on the membrane contactor so that the pressing unit presses the membrane contactor through the opening.

Accordingly, the membrane contactor can be handled together with the contactor attaching member supporting. This facilitates handling the membrane contactor which alone is not easy to handle due to its flexibility.

In one embodiment, the contactor attaching member may be made of a resin, and the membrane contactor may be integrated with the contactor attaching member by insertion molding.

Additionally, in the semiconductor element testing carrier according to the present invention, a coefficient of thermal expansion of the contactor attaching member may be substantially equal to a coefficient of thermal expansion of the membrane contactor.

Accordingly, when the semiconductor element held by the semiconductor element testing carrier is subjected to a test such as a burn-in test which is performed under an increased temperature, generation of displacement or distortion between the contactor attaching member and the membrane contactor due to a difference in thermal expansion can be prevented.

In one embodiment, the pressing unit may include an elastic member generating a pressing force applied to the membrane contactor. Alternatively, the pressing unit may include a gas spring comprising a sealed compressed gas for generating a pressing force applied to the membrane contactor. The pressing unit may include a liquid spring comprising a sealed compressible liquid for generating a pressing force applied to the membrane contactor. Additionally, the pressing unit may include a vacuum apparatus for decreasing a pressure applied on the front surface of the membrane contactor. Further, the pressing unit may include a magnetic spring comprising a pair of magnets arranged so that the same poles of the magnets are opposite to each other.

Additionally, in the semiconductor element testing carrier according to the present invention, the contacting part may define a position of the semiconductor element in a plane parallel to the first surface of the semiconductor element. Accordingly, semiconductor element is securely held at a predetermined position on the membrane contactor even when a shock or vibration is applied during a test.

Additionally, the pressing and holding member may be made of a conductive material, and the membrane contactor may be provided with a grounding pad electrically connected to the pressing and holding member. Accordingly, the pressing and holding member which surrounds the semiconductor element is made of a conductive material and is grounded. Thus, the semiconductor element is shielded from external electromagnetic waves.

In one embodiment, the pressing and holding member may be provided with a cooling fin. The cooling fin can efficiently release a heat generated by the semiconductor element during a test since the pressing and holding member directly contacts the semiconductor element.

Additionally, there is provided according to another aspect of the present invention, a method for testing a semiconductor element using a semiconductor element testing carrier for holding the semiconductor element to be tested so as to obtain an electrical contact with electrodes of the semiconductor element, the semiconductor element having a first surface on which the electrodes are formed and a second surface opposite to the first surface, the semiconductor element testing carrier comprising:

a membrane contactor having a front surface and a back surface opposite to the front surface, the membrane contactor contacting the electrodes of the semiconductor element being placed on the front surface of the membrane contactor;

a pressing unit pressing the membrane contactor toward the semiconductor element from a side of the back surface of the membrane contactor;

a pressing and holding member holding the second surface of the semiconductor element; and a contacting part protrudingly formed on one of the pressing and holding member and the membrane contactor so that the semiconductor element is held between the membrane contactor and the pressing and holding member while the membrane contactor contacts the pressing and holding member via the contacting part, the method comprising the steps of:

placing the semiconductor element at a predetermined position on the membrane contactor;

holding the semiconductor element on the membrane contactor by attaching the pressing and holding member to the membrane contactor;

pressing the back surface of the membrane contactor toward the semiconductor element; and testing the semiconductor element by connecting a tester to the semiconductor element testing carrier.

According to the above-mentioned invention, the pressing unit presses the membrane contactor from a side opposite to a side where the semiconductor element is placed. That is, the pressing unit does not directly press the semiconductor element. Additionally, the pressing and holding member holds the second surface of the semiconductor element, the second surface being opposite to the surface which contacts the membrane contactor. Further, the holding and pressing member contacts the membrane contactor via the contacting part formed on one of the pressing and holding member and the membrane contactor. Accordingly, if a shock or vibration is applied to the pressing and holding member, the semiconductor element does not move relative to the membrane contactor since the pressing and holding member is supported on the membrane contactor. Additionally, since the shock or vibration applied to the pressing and holding member is transmitted to the membrane contactor via the contacting part, a damage to the semiconductor element can be reduced.

Additionally, there is provided according to another aspect of the present invention a method for testing a semiconductor element using a semiconductor element testing carrier for holding the semiconductor element to be tested so as to obtain an electrical contact with electrodes of the semiconductor element, the semiconductor element having a first surface on which the electrodes are formed and a second surface opposite to the first surface, the semiconductor element testing carrier comprising:

a membrane contactor having a front surface and a back surface opposite to the front surface, the membrane contactor contacting the electrodes of the semiconductor element being placed on the front surface of the membrane contactor;

a pressing unit pressing the membrane contactor toward the semiconductor element from a side of the back surface of the membrane contactor;

a pressing and holding member holding the second surface of the semiconductor element; and a contacting part protrudingly formed on one of the pressing and holding member and the membrane contactor so that the semiconductor element is held between the membrane contactor and the pressing and holding member while the membrane contactor contacts the pressing and holding member via the contacting part, the method comprising the steps of:

securing the semiconductor element to the pressing and holding member;

attaching the pressing and holding member to the membrane contactor so that the semiconductor element is held at a predetermined position on the front surface of the membrane contactor;

pressing the back surface of the membrane contactor toward the semiconductor element; and testing the semiconductor element by connecting tester to the semiconductor element testing carrier.

According to this invention, since the pressing and holding member is attached to the membrane contactor after the semiconductor element is secured to the pressing and holding member, the semiconductor element does not move after the semiconductor element is positioned at the predetermined position and until the pressing unit is attached.

Additionally, there is provided according to another aspect of the present invention a semiconductor element testing apparatus comprising:

a semiconductor element testing carrier for holding a semiconductor element to be tested so as to obtain an electrical contact with electrodes of the semiconductor element, the semiconductor element having a first surface on which the electrodes are formed and a second surface opposite to the first surface, the semiconductor element testing carrier comprising:

a membrane contactor having a front surface and a back surface opposite to the front surface, the membrane contactor contacting the electrodes of the semiconductor element being placed on the front surface of the membrane contactor;

a pressing unit pressing the membrane contactor toward the semiconductor element from a side of the back surface of the membrane contactor;

a pressing and holding member holding the second surface of the semiconductor element; and a contacting part protrudingly formed on one of the pressing and holding member and the membrane contactor so that the semiconductor element is held between the membrane contactor and the pressing and holding member while the membrane contactor contacts the pressing and holding member via the contacting part;

a base supporting the membrane contactor, the base having an opening located under the membrane contactor when the contactor is placed on the base, the opening aligning with the pressing unit located under the base; and a conveyance robot provided with the pressing and holding member so as to move the semiconductor element between the predetermined position on the front surface of the membrane contactor and a tray for storing the semiconductor element, the robot holding the pressing and holding member on the membrane contactor so as to test the semiconductor element.

Other objects, features and advantages of the present invention will become more apparent from the following detailed description when read in conjunction with the accompanying drawings.

BRIEF DESCRIPTION OF THE DRAWINGS

FIG. 7A is a cross-sectional view of a pressing unit provided in a semiconductor element testing carrier according to a fourth embodiment of the present invention;

FIG. 7B is a cross-sectional view of a pressing unit provided in a semiconductor element testing carrier according to a fifth embodiment of the present invention;

FIG. 7C is a cross-sectional view of a pressing unit provided in a semiconductor element testing carrier according to a sixth embodiment of the present invention;

FIG. 7D is a cross-sectional view of a pressing unit provided in a semiconductor element testing carrier according to a seventh embodiment of the present invention;

FIG. 12 is a side view of a part of a semiconductor element testing apparatus according to the present invention; and FIG. 13 is a plane view of the semiconductor element testing apparatus according to the present invention.

DETAILED DESCRIPTION OF THE PREFERRED EMBODIMENTS

A description will now be given, with reference to FIGS. 2 and 3, of a first embodiment of the present invention.

Figure 1:
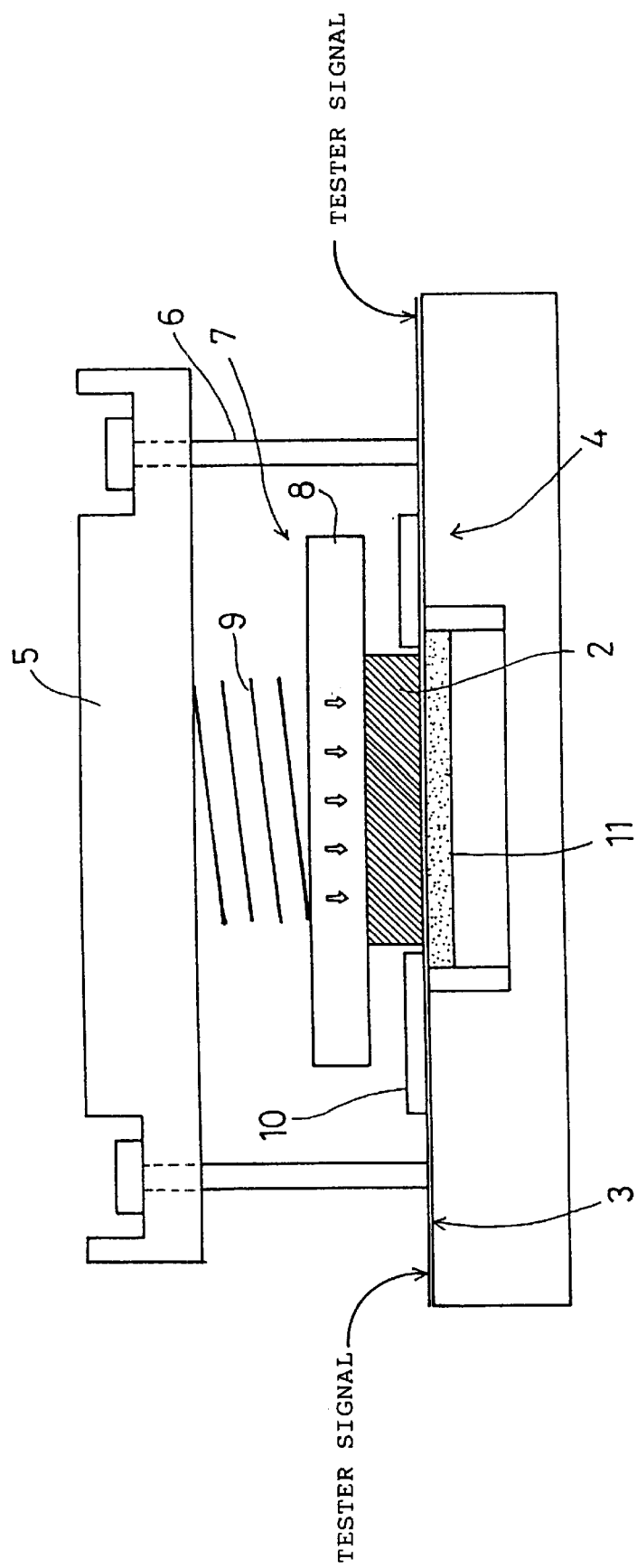
FIG. 1 is a side view of a conventional semiconductor element testing carrier.
Figure 2:
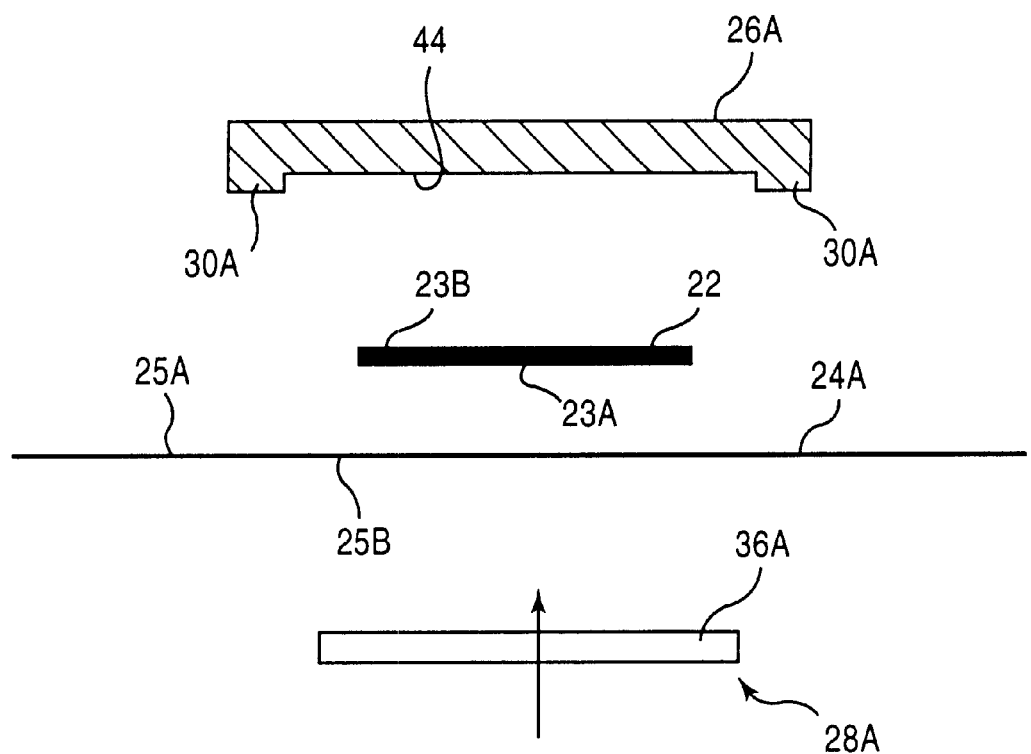
FIG. 2 is an illustrations of a semiconductor element testing carrier according to a first embodiment of the present invention, structural arts being separated from each other.
Figure 3:
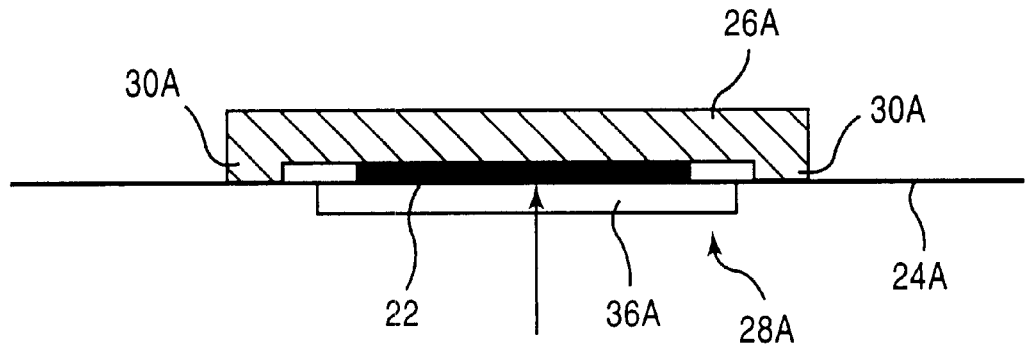
FIG. 3, is an illustration of the semiconductor element testing carrier shown in FIG. 2 in an assembled state.

FIGS. 2 and 3 are illustrations of a semiconductor element testing carrier 20A according to the first embodiment of the present invention. In FIG. 2, structural parts of the semiconductor element testing carrier 20A are separated from each other. In FIG. 3, the semiconductor element testing carrier 20A is assembled. A semiconductor element 22 is held by the semiconductor element testing carrier so as to be subjected to a test. As shown in FIGS. 2 and 3, the testing carrier 20A comprises a membrane contactor 24A, a pressing and holding member 26A and a pressing unit 28A.

The membrane contactor 24A is a flexible film-like member that is formed by a polyimide film with a conductive pattern provided thereon. The semiconductor element 22 to be tested is provided with electrodes (not shown in the figures) for external connection. The membrane contactor 24A has connection pads 98 (refer to FIG. 11) at positions that match the electrodes of the semiconductor element 22 when the semiconductor element 22 is placed at a predetermined position of the membrane contactor 24A.

The pressing and holding member 26A is formed by a hard resin having an insulating property. A cavity 44 is formed in the pressing and holding member 26A so as to accommodate the semiconductor element 22 therein. A periphery of the pressing and holding member 26A is formed as a contact part 30A which protrudes downward, that is, toward the membrane contactor 24A. It should be noted that a size of the cavity 44 is larger than a size of the semiconductor element 22.

The pressing unit 28A includes a press plate 36A. The pressing unit elastically urges the press plate 36A upwardly, that is, toward the membrane contactor 24A, by pressing the press plate by an elastic member such as a spring.

As shown in FIG. 3, the semiconductor element 22 to be tested is placed on the membrane contactor 24A, and the pressing and holding member 26A is positioned above the semiconductor element 22. On the other hand, the pressing unit 28A is positioned under the membrane contactor 24A. Accordingly, the press plate 36A presses the membrane contactor 24A toward the semiconductor element 22 from a side 25B (referred to as a back surface) opposite to a side 25G (referred to as a front surface) on which the semiconductor element 22 is placed. The pressing and holding member 26A contacts a second surface 23B upper side in the figure) of the semiconductor element 22 opposite to the first surface 23A contacting the membrane contactor 24A when the semiconductor element testing carrier 20A is assembled. In a state in which the semiconductor element 22 is held by the pressing and holding member 26A, the contacting part 30A of the pressing and holding member 26A contacts the membrane contactor 24A. Contacting part 30A defines a position of the semiconductor element in a plane 31 parallel to the first surface of the semiconductor element.

As for a method for assembling the above-mentioned semiconductor element testing carrier 20A, the following two methods may be used.

1) First method:

First, a placing process is performed. In the placing process, the semiconductor element 22 is positioned at a predetermined position on the membrane contactor 24A. After the semiconductor element 22 is precisely placed on the membrane contactor 24A, a holding process is performed in which the pressing and holding member 26A is attached to the membrane contactor 24A so as to hold the semiconductor element 22 on the membrane contactor 24A. When the holding process is completed, the contacting part 30A of the pressing and holding member 26A contacts the membrane contactor 24A. Thereafter, a pressing process is performed. In the pressing process, the membrane contactor 24A is pressed toward the semiconductor element 22 from the back side of the membrane contactor 24A. Accordingly, the membrane contactor 24A is pressed against the semiconductor element 22, and the upper surface of the semiconductor element 22 is held by the pressing and holding member 26A. Thereby, the pressing force generated by the pressing unit 28A is applied to the connection parts between the semiconductor element 22 and the membrane contactor 24A. That is, the connecting pads 98 of the membrane contactor 24A are pressed against the electrodes of the semiconductor element 22. Thereby, the semiconductor element 22 is electrically connected to the membrane contactor 24A. Thereafter, a tester is connected to the semiconductor element testing carrier 20A so as to perform a testing process in which a test is performed on the semiconductor element 22 by using the tester.

2) Second method:

First, the semiconductor element 22 is fixed on the pressing and holding member 26A. Then, the pressing and holding member 26A is positioned and attached at a predetermined position on the membrane contactor 24A while holding the semiconductor element 22 on the pressing and holding member 26A. Thereby, a holding process in which the semiconductor element 22 is held at a predetermined position on the membrane contactor 24A is achieved. When the holding process is completed, the contacting part 30A of the pressing and holding member 26A contacts the membrane contactor 24A. Thereafter, similar to the first method, a pressing process is performed so as to press the membrane contactor 24A toward the semiconductor element 22. Accordingly, the membrane contactor 24A is pressed against the semiconductor element 22 so that the connecting pads 98 of the membrane contactor 24A are electrically connected to the electrodes of the semiconductor element 22. Thereafter, a tester is connected to the semiconductor element testing carrier 20A so as to perform a testing process in which a test is performed on the semiconductor element 22 by using the tester.

Comparing the second method with the first method, the second method has an advantage in that a displacement of the semiconductor element 22 relative to the membrane contactor 24A can be prevented during a period after the semiconductor element 22 is positioned on the membrane contactor 24A and until the pressing and holding member 26A is attached. This is because, in the second method, the pressing and holding member 26A to which the semiconductor element 22 is fixed by the holding process is attached to the membrane contactor 24A.

As shown in FIG. 3, after the semiconductor element testing carrier 20A is assembled, that is, is in a state in which the semiconductor element 22 is held by the pressing and holding member 26A, the contacting part 30A of the pressing and holding member 26A is in contact with the membrane contactor 24A. Accordingly, if a shock or vibration is applied from outside, the semiconductor element 22 is not displaced relative to the membrane contactor 24A since the pressing and holding member 26A is supported on the membrane contactor 24A.

Additionally, since a shock or vibration applied to the pressing and holding member 26A is transmitted to the membrane contactor 24A via the contacting part 30A, damage to the semiconductor element 22 can be reduced. Accordingly, the electric connection between the semiconductor element 22 and the membrane contactor 24A can be maintained in a good condition. Thus, reliability of the test can be improved, and the semiconductor element 22 can be positively prevented from being damaged.

Figure 4:
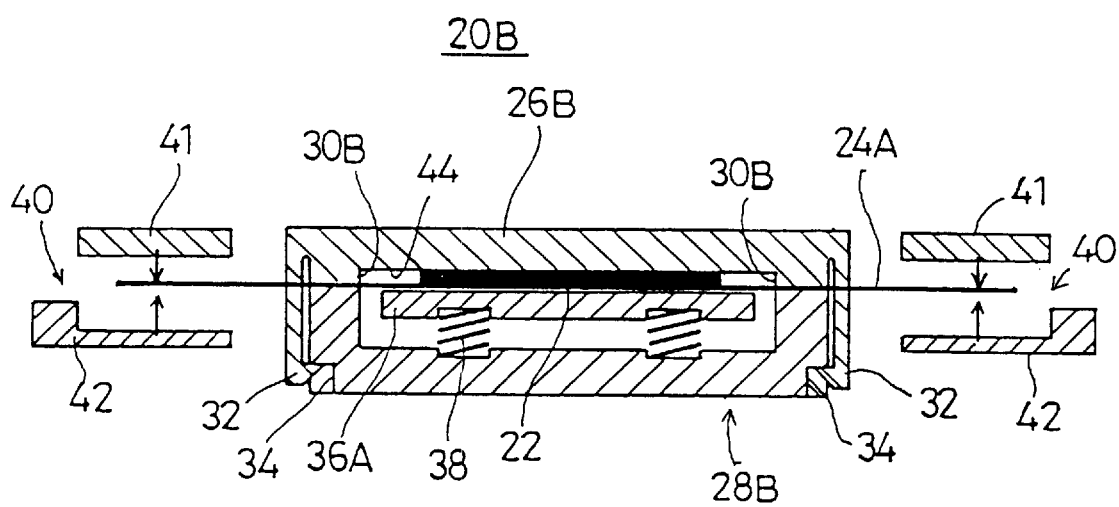
FIG. 4 is a cross-sectional view of a semiconductor element testing carrier according to a second embodiment of the present invention.

A description will now be given, with reference to FIG. 4, of a second embodiment of the present invention. FIG. 4 is a cross-sectional view of a semiconductor element testing carrier 20B according to the second embodiment of the present invention. In FIG. 4, parts that are the same as the parts shown in FIGS. 2 and 3 are given the same reference numerals, and descriptions thereof will be omitted.

In the semiconductor element testing carrier 20B shown in FIG. 4, a pressing and holding member 26B has claw portions 32 on opposite sides thereof. Additionally, a pressing unit 28B has engaging portions 34. The claw portions 32 engage the respective engaging portions 34 so that the pressing unit 28B is attached to the pressing and holding member 26B. It should be noted that the membrane contactor 24A has openings at positions aligning with the claw portions 32 so that the claw portions 32 can extend to the engaging portions 34 through the openings of the membrane contactor 24A.

Additionally, the pressing unit 28B is provided with the press plate 36A which is movable in a vertical direction. The press plate 36A is supported by coil springs 38 so that the press plate 36A can be urged upwardly by a spring force of the coil springs 38.

The above-mentioned pressing and holding member 26B and pressing unit 28B are assembled with the membrane contactor 24A interposed therebetween by the claw portions 32 of the pressing and holding member 26B being engaged with the engaging portions 34 of the pressing unit 28B. Accordingly, the pressing and holding member 26B, the membrane contactor 24A and the pressing unit 28B are assembled together in that order from the top.

In an assembled state, the pressing and holding member 26B holds the semiconductor element 22, and a contacting part 30B contacts the membrane contactor 24A. Additionally, the pressing unit 28B presses the membrane contactor 24A in a direction from the under side of the membrane contactor 24A toward the semiconductor element 22.

As mentioned above, similar to the first embodiment of the present invention, the semiconductor element testing carrier 20B according to the second embodiment of the present invention can maintain the electric connection between the semiconductor element 22 and the membrane contactor 24A in a good condition. Thus, reliability of the test can be improved, and the semiconductor element 22 can be positively prevented from being damaged.

It should be noted that a frame member 40 which surrounds the pressing and holding member 26B is provided on a periphery of the membrane contactor 24A. The frame member 40 comprises an upper half 41 and a lower half 42 each of which is made of a hard resin having an insulating property. The upper half 41 and the lower half 42 sandwich the periphery of the membrane contactor 24A therebetween, and are fixed to each other by an adhesive or a mechanical means. Accordingly, the periphery of the membrane contactor 24A having a flexibility is supported by a rigid frame 40, which facilitates handling the membrane contactor 24A during a test process. Additionally, when a tester probe makes contact with the membrane contactor 24A in the test process, a reliable contact of the tester probe can be achieved by the presence of the frame member 40 which is made of a hard material.

Figure 5:
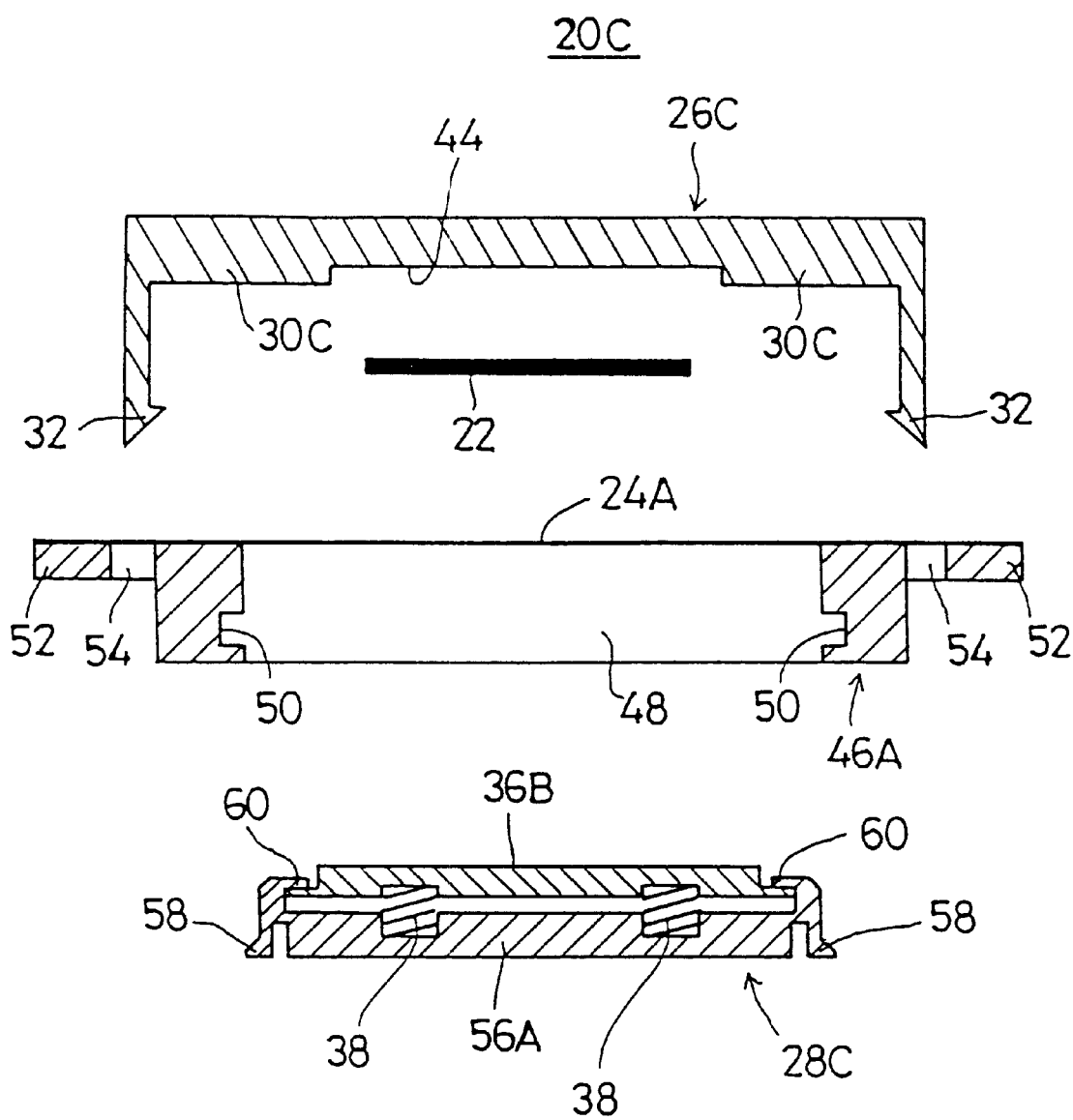
FIG. 5 is a cross-sectional view of a semiconductor element testing carrier according to a third embodiment of the present invention in a disassembled state.
Figure 6A:
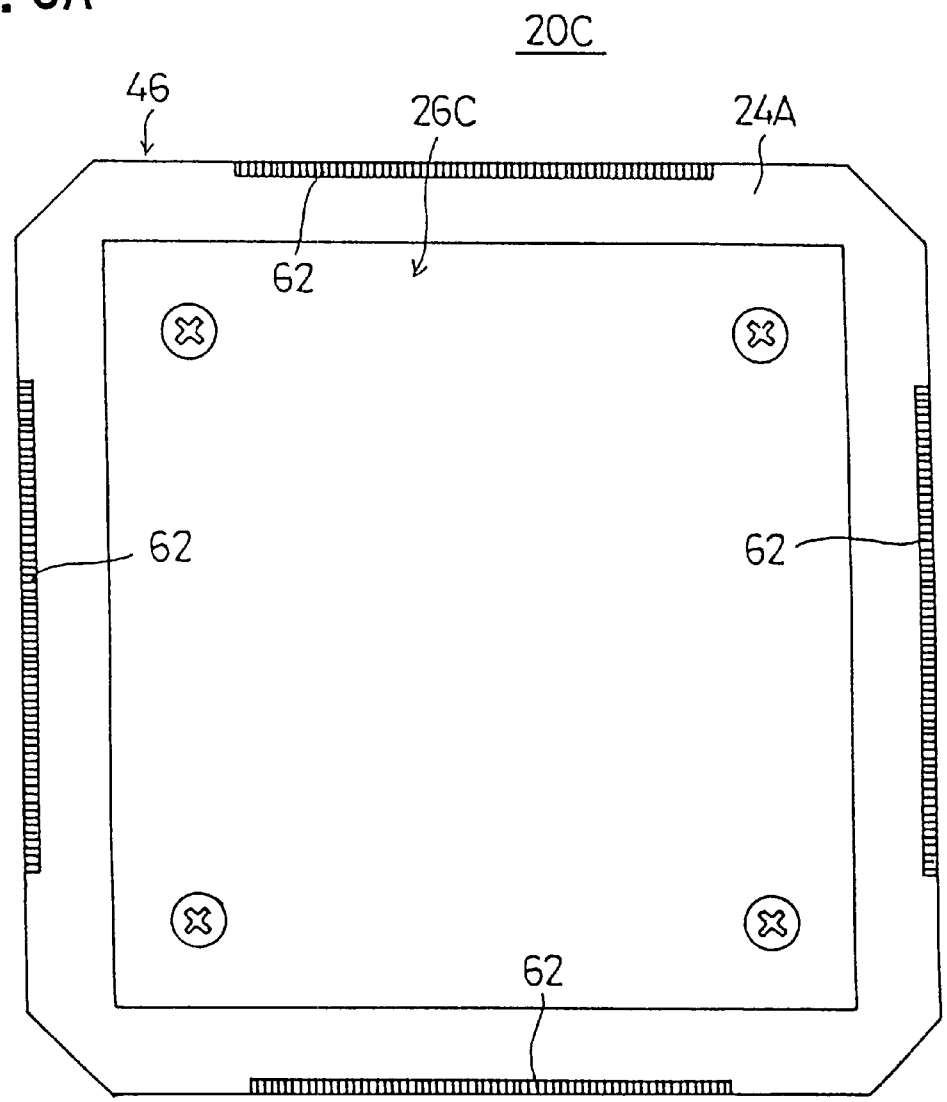
FIG. 6A is a plan view of the semiconductor element testing element shown in FIG. 5 in an assembled state.
Figure 6B:
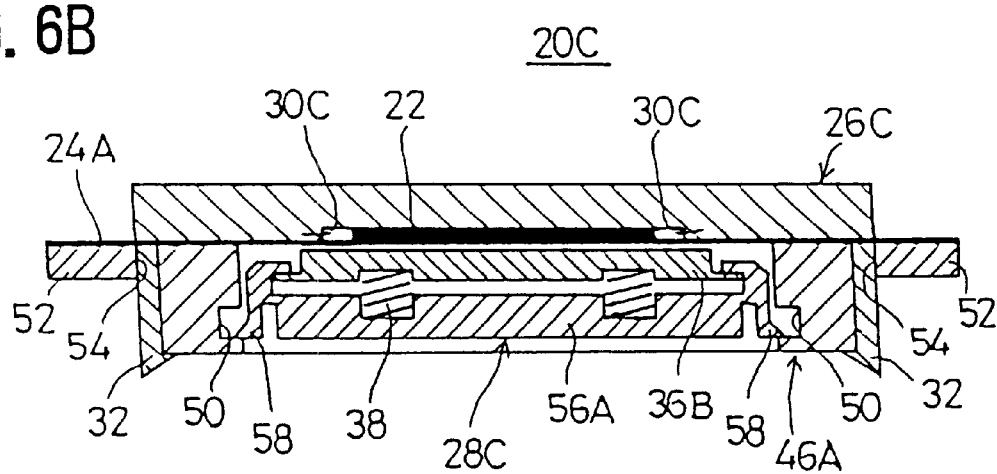
FIG. 6B is a cross-sectional view of the semiconductor element testing carrier shown in FIG. 6A.

A description will now be given, with reference to FIGS. 5, 6A and 6B, of a third embodiment of the present invention. FIG. 5 is a cross-sectional view of a semiconductor element testing carrier 20C according to the third embodiment of the present invention in a disassembled state. FIG. 6A is a plan view of the semiconductor element testing element 20C in an assembled state. FIG. 6B is a cross-sectional view of the semiconductor element testing carrier 20C shown in FIG. 6A. In FIGS. 5, 6A and 6B, parts that are the same as the parts shown in FIGS. 2, 3 and 4 are given the same reference numerals, and descriptions thereof will be omitted.

A pressing unit 28C provided in the present embodiment comprises a main body 56A and a press plate 36B. Claw portions 58 are formed on a lower part of the main body 56A. Additionally, engaging portions 60 are formed on an upper portion of the main body 56A for preventing the press plate 36B from being removed. The press plate 36B is movable upwardly or downwardly within a cavity formed in the main body 56A. The press plate 36B is urged upwardly by the springs 38 provided between the main body 56A and the press plate 36B.

In the present embodiment, a contactor attaching member 46A on which the membrane contactor 24A is attached is provided. The contactor attaching member 46A is made of an insulating resin. The contactor attaching member 46A has an opening 48 in a position aligning with a position at which the semiconductor element 22 is positioned. The membrane contactor 24A is placed on a top surface of the contactor attaching member 46A. Additionally, a brim 52 is formed on a periphery of the contactor attaching member 46A. The brim 52 is provided with the openings 54 through which claw portions 32 of a pressing and holding member 26C extend. Further, engaging portions 50 are formed on an inner surface of the opening 48 so that claw portions 58 of the pressing unit 28C are engaged with the engaging portions 50.

As mentioned above, the membrane contactor 24A is placed on the top surface of the contactor attaching member 46A. In the present embodiment, the membrane contactor 24A is fixed to the contactor attaching member 46A by means of insertion molding. That is, the membrane contactor 24A is placed in a mold die of the contactor attaching member 46A and a resin forming the contactor attaching member 46A is injected into the molding die. Accordingly, the membrane contactor 24A is integral with the contactor attaching member 46A. This eliminates an assembling process of the membrane contactor 42A and the contactor attaching member 46A, which results in a reduction in a manufacturing cost of the semiconductor element testing carrier 20C. It should be noted that the membrane contactor 24A may be fixed to the contactor attaching member by using an adhesive or a mechanical means such as a screw.

When assembling the above-mentioned semiconductor element testing carrier 20C, first the semiconductor element 22 is placed at a predetermined position on the membrane contactor 24A. Then, the pressing and holding member 26C is attached to the contactor attaching member 46A from above the membrane contactor 24A. Specifically, the claws 32 of the pressing and holding member 26C are inserted into the respective openings 54 of the contactor attaching member 46A, and the claws 32 are engaged with a bottom edge of the contactor attaching member 46A. It should be noted that the membrane contactor 24A has openings that align with the openings 54 of the contactor attaching member 46A.

As mentioned above, the contacting part 30C formed on the pressing and holding member 26C contacts the membrane contactor 24A when the pressing an holding member 26C is attached to the contactor attaching member 46A. Additionally, an inner surface of a cavity 44 formed in the pressing and holding member 26C contacts a top surface of the semiconductor element 22. Thereby, the semiconductor element 22 is held between the membrane contactor 24A and the pressing and holding member 26C.

Thereafter, the pressing unit 28C is attached to the contactor attaching member 46A from the back side of the membrane contactor 24A. The contactor attaching member 46A is secured to the contactor attaching member 46A by the claws 58 being engaged with the engaging portions 50. In this state, the press plate 36B contacts the back side of the membrane contactor 24A, and presses the membrane contactor 24A toward the semiconductor element 22 by a spring force of the coil springs 38.

As mentioned above, the pressing unit 28C contacts the back side of the membrane contactor 24A, and does not directly contacts the semiconductor element 22. Additionally, the contacting part 30C of the pressing and holding member 26C is maintained to be in contact with the membrane contactor 24A. Accordingly, similar to the first embodiment of the present invention, the semiconductor element testing carrier 20C according to the third embodiment of the present invention can maintain electric connection between the semiconductor element 22 and the membrane contactor 24A in a good condition. Thus, reliability of the test can be improved, and the semiconductor element 22 can be positively prevented from being damaged.

Additionally, in the present embodiment, since the membrane contactor 24A is attached to the contactor attaching member 46A, there is no need to handle the flexible membrane contactor alone. That is, the membrane contactor 24A can handle in a state in which the membrane contactor 24A is attached to the contactor attaching member 46A. Thus, an easy handling of the membrane contactor 24A can be achieved during an assembling operation of the semiconductor element testing carrier 20C.

Further, in the present embodiment, a coefficient of thermal expansion of the membrane contactor 24A is nearly equal to a coefficient of thermal expansion of the contactor attaching member 46A. Specifically, the membrane contactor 24A is made of polyimide, and the contactor attaching member 46A is made of polyetherimide (coefficient of thermal expansion: $25 \times 10^{-6}/°C$.).

As mentioned above, as a result of the contactor attaching member 46A being made of polyetherimide, a displacement and a distortion are not generated between the membrane contactor 24A and the semiconductor element 22 during a test performed under an ordinary temperature and a burn-in test performed under an increased temperature (about 125° C.). Thus, there is no damage generated in a contacting area between the semiconductor element 22 and the membrane contactor 24A. It should be noted that polyetherimide having a coefficient of thermal expansion of $14 \times 10^{-6}/°C$. may be used for a material of the contactor attaching member 46A, if necessary.

A description will now be given, with reference to FIGS. 7A, 7B, 7C and 7D, of fourth to seventh embodiments of the present invention. FIGS. 7A, 7B, 7C and 7D show pressing units 28D, 28E, 28F and 28G provided in semiconductor element testing carrier according to the fourth to seventh embodiments. Since each of the semiconductor element testing carriers according to the fourth to seventh embodiments have the same structure as the semiconductor element testing carrier 20C shown in FIGS. 5, 6A and 6B except for the pressing units 28D, 28E, 28F and 28G, descriptions of parts other than the pressing units 28D, 28E, 28F and 28G will be omitted.

FIG. 7A is a cross-sectional view of the pressing unit 28D provided in the semiconductor element testing carrier according to the fourth embodiment of the present invention. In the fourth embodiment, a fluid spring 64 is used for the pressing unit 28D. The fluid spring 64 shown in FIG. 7A is formed by a fluid 67 of either compressed air or a compressible liquid confined in a sealed bag 66. A gas other than air can be used for the fluid spring 64. By using the thus-constructed pressing unit 28D, the membrane contactor 24A can be pressed against the semiconductor element 22 with a uniform pressure distribution. A fluid spring formed by a compressible liquid does not reduce its volume under a high pressure, and a volume change in a test performed under a high-temperature can be reduced.

FIG. 7B is a cross-sectional view of the pressing unit 28E provided in the semiconductor element testing carrier according to the fifth embodiment of the present invention. In the fifth embodiment, a press plate 36C is movably provided within a cavity formed in a main body 56C of the pressing unit 28E. The press plate 36C has a sealing member 69 which seals between an inner surface of the main body 56C and a side of the press plate 36C so that a gas or liquid is confined in a space defined by the main body 56C and the press plate 36C. According to the present embodiment, similar to the above-mentioned fourth embodiment, the membrane contactor 24A can be pressed against the semiconductor element 22 with a uniform pressure distribution. Additionally, when a compressible liquid is used, such a liquid spring does not reduce its volume under a high pressure, and a volume change in a test performed under a high-temperature can be reduced.

FIG. 7C is a cross-sectional view of the pressing unit 28F provided in the semiconductor element testing carrier according to the sixth embodiment of the present invention. In the sixth embodiment, an elastic block 70 is used in the pressing unit 28F. The elastic block 70 directly presses the membrane contactor 24A. The elastic block 70 can be made of an elastic material such as a rubber, and thus the elastic block 70 can be easily obtained at a low cost.

FIG. 7D is a cross-sectional view of the pressing unit 28G provided in the semiconductor element testing carrier according to the seventh embodiment of the present invention. In the seventh embodiment, a first magnet 71 and a second magnet 72 are used for forming the pressing unit 28G. The first magnet 71 is embedded in a main body 56D of the pressing unit 28G. The second magnet 72 is embedded in a press plate 36D which is movable relative to the main body 56D in a vertical direction. The first magnets 71 and the second magnets 72 are arranged so that the same pole of the magnets are opposed to each other. Accordingly, a repulsion force is generated between the first magnet 71 and the second magnet 72. The press plate 36D is urged upwardly by the repulsion force. That is, the first magnet 71 and the second magnet 72 together form a magnetic spring. By using such a magnetic spring, a uniform pressure can be applied to an entire surface to be pressed as compare to a mechanical spring such as a coil spring. Thus, a stable pressing operation can be achieved.

Figure 8:
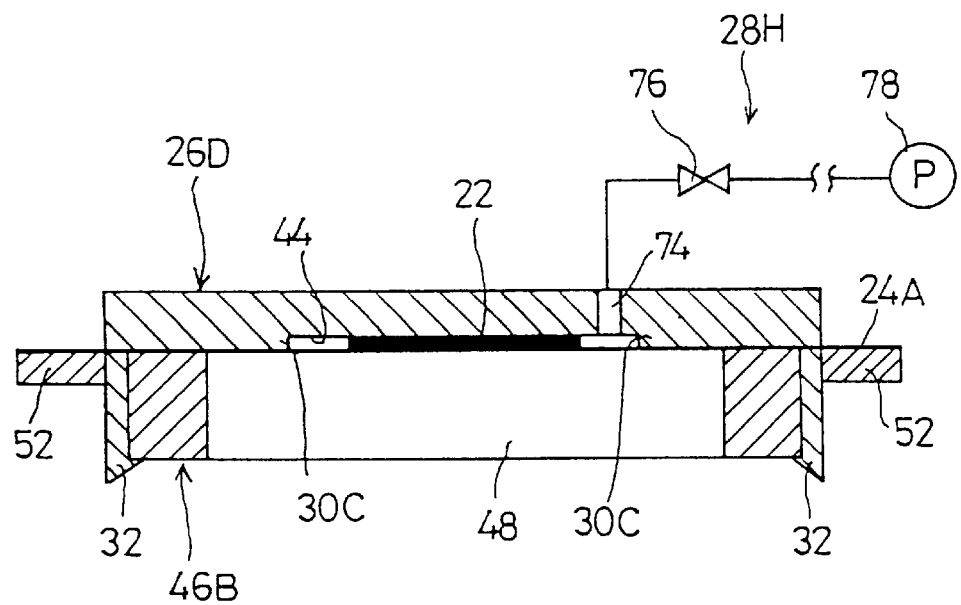
FIG. 8 is a cross-sectional view of a semiconductor element testing carrier according to an eighth embodiment of the present invention.

A description will now be given, with reference to FIG. 8, of an eighth embodiment of the present invention. FIG. 8 is a cross-sectional view of a semiconductor element testing carrier 20D according to the eighth embodiment of the present invention. In FIG. 8, parts that are the same as the parts shown in FIGS. 2 to 5 are given the same reference numerals, and descriptions thereof will be omitted.

The semiconductor element testing carrier 20D according to the present invention has a pressing unit 28H which introduces a vacuum pressure into a chamber defined by the membrane contactor 24A and a cavity 44 formed in a pressing and holding member 26D. That is, a through hole 74 is formed in the pressing and holding member 26D so that a vacuum pump 78 is connected to the hole 74. A valve 76 is provided between the hole 74 and the vacuum pump 78 so as to release a vacuum pressure in the cavity 44.

When assembling the semiconductor element testing carrier 20D, first the semiconductor element 22 is placed at a predetermined position on the membrane contactor 24A which is placed on the contactor attaching member 46B. Then, the pressing and holding member 26D is attached to the contactor attaching member 46B from above the membrane contactor 24A. The contacting part 30C formed on the pressing and holding member 26D contacts the membrane contactor 24A when the pressing an holding member 26D is attached to the contactor attaching member 46B. Additionally, an inner surface of the cavity 44 of the pressing and holding member 26D contacts the top surface of the semiconductor element 22. Thereby, the semiconductor element 22 is held between the membrane contactor 24A and the pressing and holding member 26D.

Thereafter, the vacuum pump 78 is connected to the through hole 74, and the vacuum pump 78 is operated while opening the valve 76 so as to evacuate air within the space defined by the cavity 44 and the membrane contactor 24A. Accordingly, a vacuum level in the space where the semiconductor element 22 is accommodated is increased. On the other hand, since an atmospheric pressure is applied to the back side of the membrane contactor 24A, the membrane contactor 24A presses the semiconductor element 22 upwardly toward the pressing and holding member 26D.

In this state, the semiconductor element 22 is pressed only by the membrane contactor 24A. Additionally, the contacting part 30C of the pressing and holding member 26D is maintained to be in contact with the membrane contactor 24A. Accordingly, similar to the first embodiment of the present invention, the semiconductor element testing carrier 20D according to the eighth embodiment of the present invention can maintain electric connection between the semiconductor element 22 and the membrane contactor 24A in a good condition. Thus, reliability of the test can be improved, and the semiconductor element 22 can be positively prevented from being damaged.

Additionally, in the present embodiment, a vacuum pressure generated by the vacuum pump 78 is used as the pressing unit 28H. In such a structure, the semiconductor element testing carrier 20D does not require a mechanical part constituting the pressing unit 28H. Thus, the semiconductor element testing carrier 20D has a simple structure. That is, no mechanical part is provided to the opening 48 of the contactor attaching member 46B.

Figure 9:
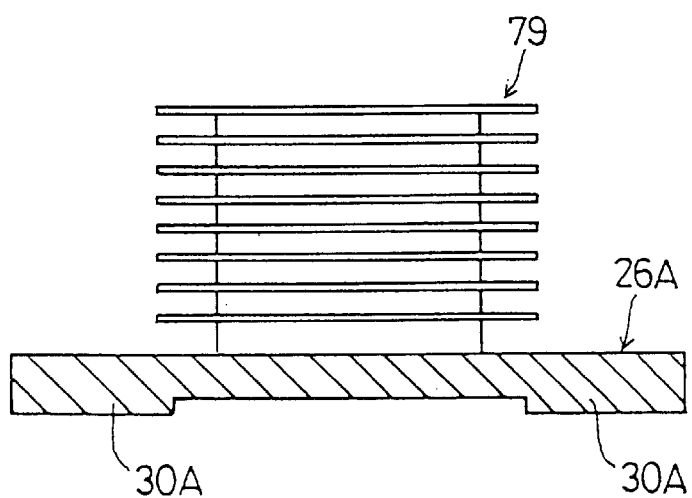
FIG. 9 is an enlarged view of a pressing and holding member provided in a semiconductor element testing carrier according to a ninth embodiment of the present invention.

A description will now be given, with reference to FIG. 9, of a ninth embodiment of the present invention. FIG. 9 is an enlarged view of a pressing and holding member 26A provided in a semiconductor element testing carrier according to the ninth embodiment of the present invention. It should be noted that the semiconductor element testing carrier according to the ninth embodiment has the same structure as the semiconductor element testing carrier according to the above-mentioned embodiments except for cooling fins 79 being attached to the pressing and holding member 26A.

As appreciated from the above-mentioned embodiments, the pressing and holding member 26A contacts the semiconductor element 22 when the semiconductor element testing carrier is in an assembled state. Accordingly, by providing the cooling fins 79 to the pressing and holding member 26A, a heat generated by the semiconductor element 22 during a test can be efficiently released to the atmosphere. It should be noted that the pressing and holding member 26A is preferably made of a material having a good thermal transmission characteristic.

Figure 10:
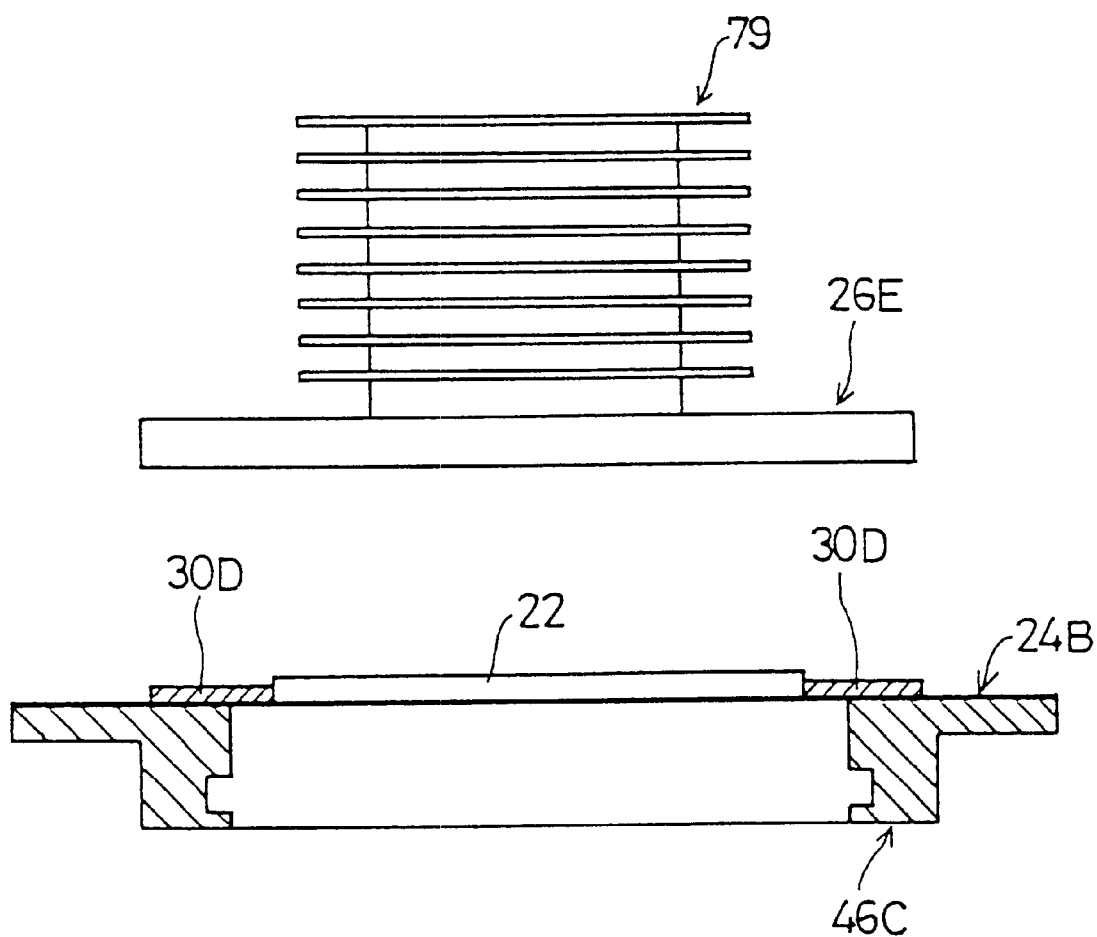
FIG. 10 is an enlarged view of a pressing and holding member and a contactor attaching member provided in a semiconductor element testing carrier according to a tenth embodiment of the present invention.

A description will now be given, with reference to FIG. 10, of a tenth embodiment of the present invention. FIG. 10 is an enlarged view of the pressing and holding member and a contactor attaching member provided in a semiconductor element testing carrier according to the tenth embodiment of the present invention. It should be noted that the semiconductor element testing carrier according to the tenth embodiment has the same structure as the semiconductor element testing carrier according to the above-mentioned embodiments except for a contacting part 30D provided on a membrane contactor 24B.

In the tenth embodiment, the contacting part 30D is provided on the membrane contactor 24B. The membrane contactor 24B also serves as a positioning member for positioning the semiconductor element 22 in a plane parallel to the membrane contactor 24B. The contacting part 30D may be fixed to the membrane contactor 24B by adhesive, or deposited on the membrane contactor 24B by metal plating.

According to the present embodiment, a bottom surface of the pressing and holding member 26E can be a flat surface since the pressing and holding member 26E is not required to serve as a positioning member for the semiconductor element 22. Thus, the pressing and holding member 26E can be manufactured easier than the pressing and holding member having the contacting part 30A, 30B or 30C.

Additionally, in an assembled state, the pressing and holding member 26E contacts the contacting part 30D, and supported on the membrane contactor 24B via the contacting part 30D. Additionally, the pressing and holding member 26E contacts the top surface of the semiconductor element 22. Accordingly, similar to the above-mentioned embodiments of the present invention, the semiconductor element testing carrier according to the tenth embodiment of the present invention can maintain the electric connection between the semiconductor element 22 and the membrane contactor 24B in a good condition. Thus, reliability of the test can be improved, and the semiconductor element 22 can be positively prevented from being damaged.

Further, in the present embodiment, since the contacting part 30D serves as a positioning member for positioning the semiconductor element 22, the semiconductor element 22 is not displaced relative to the membrane contactor 24B if a shock or vibration is applied from outside during a test. Thus, reliability of the test can be improved, and a contact between the semiconductor element 22 and the membrane contactor 24B can be prevented from being subjected to a stress.

Figure 11:
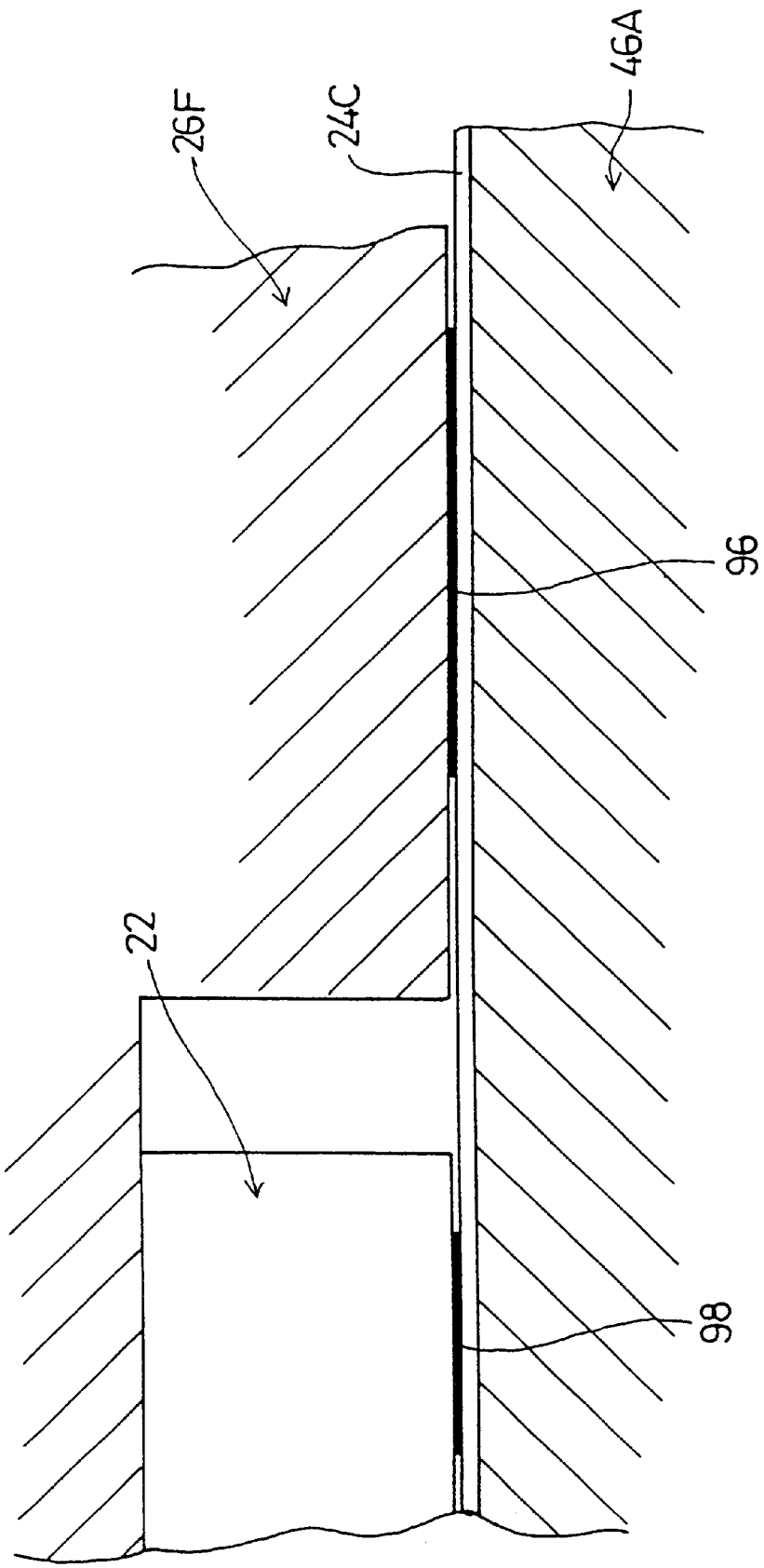
FIG. 11 is an enlarged view of a connecting part between a membrane contactor and a pressing and holding member provided in a semiconductor element testing carrier according to an eleventh embodiment of the present invention.

A description will now be given, with reference to FIG. 11, of an eleventh embodiment of the present invention. FIG. 11 is an enlarged view of a connecting part between a membrane contactor 24C and a pressing and holding member 26F provided in a semiconductor element testing carrier 20E according to the eleventh embodiment of the present invention. It should be noted that the semiconductor element testing carrier according to the eleventh embodiment has the same structure as the semiconductor element testing carrier according to the above-mentioned embodiments except for a grounding pad 96 being formed on a membrane contactor 24C and a pressing and holding part 26F being made of a conductive material Specifically, the pressing and holding member 26F is made of a conductive metal such as aluminum or copper. The membrane contactor 24C is provided with the grounding pad 96 in addition to the connecting pads 98 which are connected to the electrodes of the semiconductor element 22. The grounding pad 96 is connected to a grounding pattern formed on the membrane contactor 24C.

According to the above-mentioned structure, when the semiconductor element testing carrier 20E is assembled, the grounding pad 96 is electrically connected to the pressing and holding member 26F. Accordingly, the pressing and holding member 26F is grounded. Since the pressing and holding member 26F covers the semiconductor element 22, the semiconductor element 22 is shielded against external electromagnetic waves. On the other hand, when the semiconductor element 22 is one which is driven by a high-frequency, electromagnetic waves radiated by the semiconductor element 22 can be prevented from leaking outside the pressing and holding member 26F.

A description will now be given, with reference to FIGS. 12 and 13, of a semiconductor element testing apparatus according to the present invention. FIG. 12 is a side view of a part of a semiconductor element testing apparatus 80 according to the present invention. FIG. 13 is a plane view of the semiconductor element testing apparatus 80 according to the present invention.

The semiconductor element testing apparatus 80 is adapted to use any one of the semiconductor element testing carriers 20A to 20E according to the above-mentioned first to eleventh embodiments of the present invention. It is assumed that the semiconductor element testing apparatus 80 uses the semiconductor element testing carrier 20A according to the first embodiment.

The semiconductor element testing apparatus 80 comprises the membrane contactor 24A, a pressing unit 28I, a base 82 and conveyance robot 84. The base 82 has an opening 88 under which the pressing unit 36E is located. The membrane contactor 24A is supported by the base 82 above the opening 88.

As shown in FIG. 13, three trays 90, 92 and 94 are placed on the base 82. The tray 90 is for storing the semiconductor elements 22 to be tested. The tray 92 is for storing the semiconductor elements 22 that have been tested and determined to be non-defective. The tray 93 is for storing the semiconductor element 22 that have been tested and determined to be defective.

The conveyance robot 84 has an arm 86 provided with the pressing an holding member 26A on an end thereof. The arm 86 is movable in directions indicated by arrows X and Z, and is pivotable as indicated by arrows θ. By using the conveyance robot 84, the semiconductor element 22 is picked up from the tray 90 and is moved to a predetermined position on the membrane contactor 24A so as to perform a test on the semiconductor element 22. After the test has been completed, the semiconductor element 22 is conveyed to one of the trays 92 and 94 according to a result of the test.

The pressing unit 28I is positioned under the base 82 so that the press plate 36E is moved in the directions indicated by the arrow Z. In the semiconductor element testing apparatus 80, an air cylinder is used to move the press plate 36E.

According to the above-mentioned semiconductor element testing apparatus 80, the semiconductor element 22 can be conveyed between the predetermined position on the membrane contactor 24A and each of the trays 90, 92 and 94. Accordingly, a test for the semiconductor element 22 can be automatically and efficiently performed. Additionally, a positioning accuracy of the semiconductor element 22 relative to the membrane contactor 24A is increased, and a reliable test can be achieved.

The present invention is not limited to the specifically disclosed embodiments, and variations and modifications may be made without departing from the scope of the present invention.

The present application is based on Japanese priority application No. 10-37718 filed on Feb. 19, 1998, the entire contents of which are hereby incorporated by reference.

What is claimed is:

1. A semiconductor element testing carrier for holding a semiductor element during testing so as to obtain an electrical contact with electrodes of the semiconductor element, said semiconductor element having a first surface on which the electrodes are formed and a second surface opposite to said first surface, said semiconductor element testing carrier comprising:

a membrane contactor having a front surface and a back surface opposite to said front surface, said membrane contactor contacting the electrodes of said semiconductor element being placed on said front surface of said membrane contactor;

a pressing unit pressing said membrane contactor against said semiconductor element by contacting and pressing said back surface of said membrane contactor at least at an area of said back surface directly opposite to said semiconductor element;

a pressing and holding member holding said second surface of said semiconductor element; and a contacting part located in an area surrounding the semiconductor element to define a space having a horizontal size which is larger than a horizontal size of said semiconductor element being tested, so that said semiconductor element is held between said membrane contactor and said pressing and holding member while said membrane contactor contacts and is being pressed by said contacting part so as to maintain said membrane contactor and said pressing and holding member substantially parallel to each other.

2. The semiconductor element testing carrier as claimed in claim 1, wherein said membrane contactor is provided with a frame member made of a hard material, said frame member being attached to a periphery of said membrane contactor so that said frame member surrounds said pressing and holding member.

3. The semiconductor element testing carrier as claimed in claim 1, wherein said pressing unit includes an elastic member generating a pressing force applied to said membrane contactor.

4. The semiconductor element testing carrier as claimed in claim 1, wherein said pressing unit includes a fluid spring comprising a sealed compressed gas for generating a pressing force applied to said membrane contactor.

5. The semiconductor element testing carrier as claimed in claim 1, wherein said pressing unit includes a fluid spring comprising a sealed liquid for generating a pressing force applied to said membrane contactor.

6. The semiconductor element testing carrier as claimed in claim 1, wherein said pressing unit includes a magnetic spring comprising a pair of magnets arranged so that the same poles of the magnets are opposite to each other.

7. The semiconductor element testing carrier as claimed in claim 1, wherein said contacting part defines a position of said semiconductor element in a plane parallel to said first surface of said semiconductor element.

8. The semiconductor element testing carrier as claimed in claim 1, wherein said pressing and holding member is made of a conductive material, and said membrane contactor is provided with a grounding pad electrically connected to said pressing and holding member.

9. The semiconductor element testing carrier as claimed in claim 1, wherein said pressing and holding member is provided with a cooling fin.

10. The semiconductor element testing carrier as claimed in claim 1, further comprising a contactor attaching member supporting said back surface of said membrane contactor, said contactor attaching member having an opening aligning with said semiconductor element placed on said membrane contactor so that said pressing unit presses said membrane contactor by acting through said opening.

11. The senmiconductor element testing carrier as claimed in claim 10, wherein said contactor attaching member is made of a resin, and said membrane contactor is integrated with said contactor attaching member by insertion molding.

12. The semiconductor element testing carrier as claimed in claim 10, wherein a coefficient of thermal expansion of said contactor attaching member is substantially equal to a coefficient of thermal expansion of said membrane contactor.

13. A semiconductor element testing carrier for holding a semiconductor element during testing so as to obtain an electrical contact with electrodes of the semiconductor element, said semiconductor element having a first surface on which the electrodes are formed and a second surface opposite to said first surface, said semiconductor element testing carrier comprising:

a membrane contactor having a front surface and a back surface opposite to said front surface, said membrane contactor contacting the electrodes of said semiconductor element being placed on said front surface of said membrane contactor;

a pressing unit pressing said membrane contactor against said semiconductor element;

apressing and holding member holding said second surface of said semiconductor element; and a contacting part located in an area surrounding the semiconductor element to define a space having a horizontal size which is larger than a horizontal size of said semiconductor element being tested, so that said semiconductor element is held between said membrane contactor and said pressing and holding member while said membrane contactor contacts and is being pressed by said contacting part so as to maintain said membrane contactor and said pressing and holding member substantially parallel to each other, wherein said pressing and holding member includes a vacuum apparatus for decreasing a pressure applied on said front surface of said membrane contactor.

14. A method for testing a semiconductor element using a semiconductor element testing carrier for holding the semiconductor element during testing so as to obtain an electrical contact with electrodes of the semiconductor element, said semiconductor element having a first surface on which the electrodes are formed and a second surface opposite to said first surface, said semiconductor element testing carrier comprising:

a membrane contactor having a front surface and a back surface opposite to said front surface, said membrane contactor contacting the electrodes of said semiconductor element being placed on said front surface of said membrane contactor;

a pressing unit pressing said membrane contactor against said semiconductor element by contacting and pressing said back surface of said membrane contactor at least at an area of said back surface directly opposite to said semiconductor element;

a pressing and holding member holding said second surface of said semiconductor element; and a contacting part located in an area surrounding the semiconductor element to define a space having a horizontal size which is larger than a horizontal size of said semiconductor element being tested, so that said semiconductor element is held between said membrane contactor and said pressing and holding member while said membrane contactor contacts and is being pressed by said contacting part so as to maintain said membrane contactor and said pressing and holding member substantially parallel to each other, the method for testing comprising the steps of:

placing said semiconductor element at a predetermined position on said membrane contactor;

holding said semiconductor element on said membrane contactor by attaching said pressing and holding member to said membrane contactor;

pressing the back surface of said membrane contactor, at least at an area directly opposite to said semiconductor element, against said semiconductor element; and testing said semiconductor element by connecting a tester to said semiconductor element testing carrier.

15. A method for testing a semiconductor element using a semiconductor element testing carrier for holding the semiconductor element during testing so as to obtain an electrical contact with electrodes of the semiconductor element, said semiconductor element having a first surface on which the electrodes are formed and a second surface opposite to said first surface, said semiconductor element testing carrier comprising:

a membrane contactor having a front surface and a back surface opposite to said front surface, said membrane contactor contacting the electrodes of said semiconductor element being placed on said front surface of said membrane contactor;

a pressing unit pressing said membrane contactor against said semiconductor element by contacting and pressing said back surface of said membrane contactor, at least at an area directly opposite to said semiconductor element;

a pressing and holding member holding a second surface of said semiconductor element;

a contacting part located in an area surrounding the semiconductor element to define a space having a horizontal size which is larger than a horizontal size of said semiconductor element being tested, so that said semiconductor element is held between said membrane contactor and said pressing and holding member while said membrane contactor contacts and is being pressed by said contacting part so as to maintain said membrane contactor and said pressing and holding member substantially parallel to each other, the method for testing comprising the steps of:
securing said semiconductor element to said pressing and holding member;
attaching said pressing and holding member to said membrane contactor so that said semiconductor element is held at a predetermined position on said front surface of said membrane contactor;
pressing the back surface of said membrane contactor, at least at an area directly opposite to said semiconductor element, against said semiconductor element; and
testing said semiconductor element by connecting a tester to said semiconductor element testing carrier.

16. A semiconductor element testing apparatus comprising:

a semiconductor element testing carrier for holding a semiconductor element during testing so as to obtain an electrical contact with electrodes of the semiconductor element, said semiconductor element having a first surface on which the electrodes are formed and a second surface opposite to said first surface, said semiconductor element testing carrier comprising:

a membrane contactor having a front surface and a back surface opposite to said front surface, said membrane contactor contacting the electrodes of said semiconductor element being placed on said front surface of said membrane contactor;

a pressing unit pressing said membrane contactor against said semiconductor element by contacting and pressing said back surface of said membrane contactor, at least at an area directly opposite to said semiconductor element;

a pressing and holding member holding said second surface of said semiconductor element;

a contacting part located in an area surrounding the semiconductor element to define a space having a horizontal size which is larger than a horizontal size of said semiconductor element being tested, so that said semiconductor element is held between said membrane contactor and said pressing and holding member while said membrane contactor contacts and is being pressed by said contacting part so as to maintain said membrane contactor and said pressing and holding member substantially parallel to each other, a base supporting said membrane contactor, said base having an opening located under said membrane contactor when said contactor is placed on said base, said opening aligning with said pressing unit located under said base; and a conveyance robot provided with said pressing and holding member so as to move said semiconductor element between the predetermined position on the front surface of said membrane contactor and a tray for storing said semiconductor element, said robot holding said pressing and holding member on said membrane contactor so as to test said semiconductor element.

* * * * *